(12) United States Patent
Chiang et al.

(10) Patent No.: US 8,033,013 B2
(45) Date of Patent: Oct. 11, 2011

(54) METHOD OF MAKING RIGID-FLEXIBLE PRINTED CIRCUIT BOARD HAVING A PEELABLE MASK

(75) Inventors: Yen Ching Chiang, Taoyuan County (TW); Shih Chia Fang, Taoyuan County (TW); Jun Yi Wang, Taoyuan County (TW); Hsiu Lin Huang, Taoyuan County (TW)

(73) Assignee: Compeq Manufacturing Co., Ltd., Lujhu Township, Taoyuan County (TW)

( * ) Notice: Subject to any disclaimer, the term of this patent is extended or adjusted under 35 U.S.C. 154(b) by 701 days.

(21) Appl. No.: 12/164,799

(22) Filed: Jun. 30, 2008

(65) Prior Publication Data

US 2009/0321112 A1    Dec. 31, 2009

(51) Int. Cl.
*H05K 3/02* (2006.01)
*H05K 1/03* (2006.01)

(52) U.S. Cl. ............... 29/846; 29/830; 29/831; 29/832; 29/847; 29/852; 174/255

(58) Field of Classification Search .............. 29/846, 29/852, 832, 830, 831, 847; 156/630, 629, 156/645; 216/18, 20, 52, 95; 174/255, 262, 174/254; 427/96.2, 97.1, 97.7
See application file for complete search history.

(56) References Cited

U.S. PATENT DOCUMENTS

| | | | | |
|---|---|---|---|---|
| 4,715,928 A | * | 12/1987 | Hamby | 216/18 |
| 4,869,767 A | * | 9/1989 | Robinson et al. | 156/233 |
| 5,499,444 A | * | 3/1996 | Doane et al. | 29/830 |
| 6,178,093 B1 | * | 1/2001 | Bhatt et al. | 361/795 |
| 7,281,328 B2 | | 10/2007 | Lee et al. | |

FOREIGN PATENT DOCUMENTS

TW    M259439    3/2005

* cited by examiner

*Primary Examiner* — Derris Banks
*Assistant Examiner* — Tai Nguyen
(74) *Attorney, Agent, or Firm* — Muncy, Geissler, Olds & Lowe, PLLC

(57) ABSTRACT

The invention relates to a method of fabricating a flexible-rigid PCB which includes a flexible circuit substrate and a rigid circuit substrate. The flexible circuit substrate defines a rigid region and an exposed region and has a conductive pattern, such as conductive traces, formed on the exposed region. The method includes the steps of providing the flexible circuit substrate; printing a paste containing epoxy-silicone hybrid materials onto the conductive pattern; curing the paste; and building up the rigid circuit substrate on the rigid region of the flexible circuit substrate. Particularly, the paste having a specific composition is subjected to predetermined conditions of temperature and time in order to transform the paste into a peelable mask with heat resistance, chemical resistance and a contact angle greater than 20 degrees.

1 Claim, 4 Drawing Sheets

METHOD OF MAKING RIGID-FLEXIBLE PRINTED CIRCUIT BOARD HAVING A PEELABLE MASK

BACKGROUND OF INVENTION

1. Field of Invention

This invention relates to techniques of manufacturing a rigid-flexible printed circuit board (rigid-flex PCB), and more particularly to form a reliable peelable mask on a flexible circuit substrate to protect conductive patterns, such as conductive traces, from damage while processing.

2. Related Prior Art

Taiwan utility model Patent No. M259439 discloses a protect layer printed on conductive traces of a (rigid) printed circuit board. The protect layer is made of silicone-based paste, which may be cured under ultra-violet light. The protect layer is elastic with a thickness about 0.1 to 0.2 mm and is bearable under a temperature up to 250□ such that the protect layer may endure through an electroplating process or a reflow process and then be peeled away. However, a rigid-flex PCB is substantially more difficult to manufacture than the rigid one, due to its fragile characteristics. Accordingly, the aforementioned protect layer which is usually subject to severe conditions may not be suitable for use in the rigid-flex PCB.

As disclosed in the background section of U.S. Pat. No. 7,281,328, a conventional process of fabricating a rigid-flex PCB is disclosed, including the step of forming a resist cover on a part of a flexible region of the rigid-flex PCB. The resist cover functions to protect the internal circuit pattern which is to be exposed for use in an external pad or a mounting pad. In the case where the resist cover is formed of peelable ink, the peelable ink may be easily removed by further applying peelable ink on the formed peelable ink to form an ink layer having a predetermined thickness and then removing the ink layer. However, under harsh chemical and physical conditions, residue may remain after removal of the peelable resist cover, contamination may occur, and therefore a defect rate is increased, resulting in drastically decreased reliability.

SUMMARY OF INVENTION

Accordingly, it is the primary object of the present invention to provide a method capable of producing an improved rigid-flex PCB using a peelable mask.

The present invention relates to the rigid-flex PCB which mainly includes a flexible circuit substrate and a rigid circuit substrate. The flexible circuit substrate defines a rigid region and an exposed region and has a conductive pattern, such as conductive traces, formed on the exposed region. The method includes the steps of providing the flexible circuit substrate; printing a paste containing epoxy-silicone hybrid materials onto the conductive pattern via a screen printing method under predetermined conditions; curing the paste; and building up the rigid circuit substrate on the rigid region of the flexible circuit substrate. Particularly, the paste having a specific composition is subjected to predetermined conditions of temperature and time in order to transform the paste into a peelable mask with heat resistance, chemical resistance and a contact angle greater than 20 degrees.

The present invention and the advantages thereof will become more apparent upon consideration of the following detailed description when taken in conjunction with the accompanying drawings.

DETAILED DESCRIPTION OF EMBODIMENTS

Figure 1:
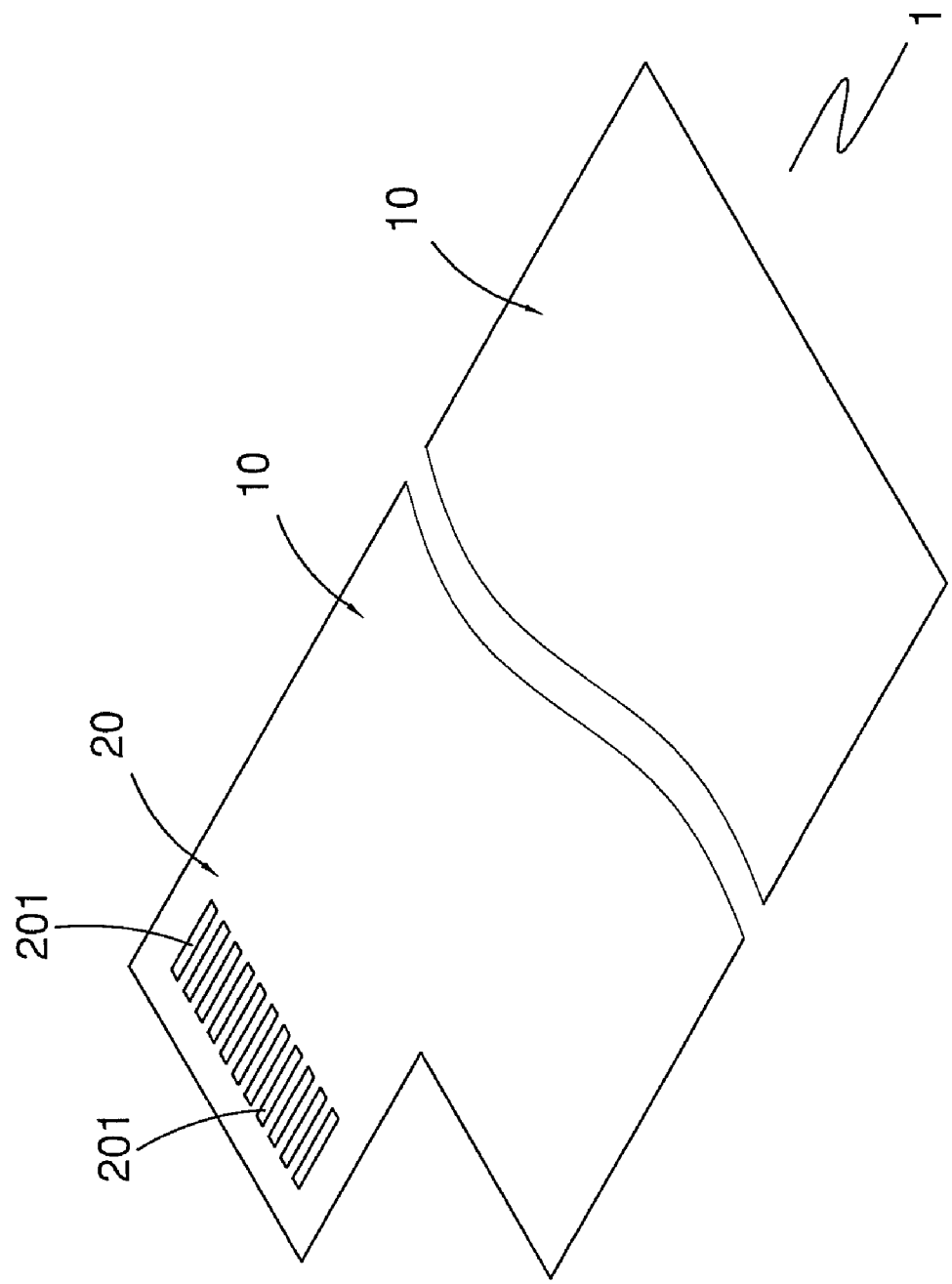
FIG. 1 is a perspective view of a flexible circuit board.

FIGS. 1 to 5 illustrate a method of fabricating a rigid-flex PCB according to the present invention, the method including the steps as follows:

As shown in FIG. 1, a flexible circuit substrate 1 defining a rigid region 10 and an exposed region 20 is provided. The flexible circuit substrate 1 has a conductive pattern 201, such as conductive traces, formed on the exposed region 20. The flexible circuit substrate 1 further has a circuit pattern (not shown) formed on the rigid region 10 to be bonded with a rigid circuit substrate 4, which will be described hereinafter.

Figure 2:
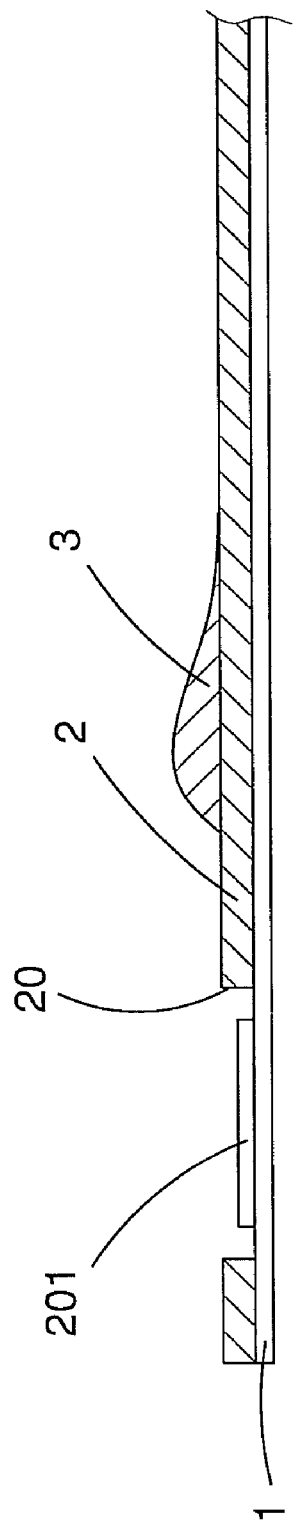
FIG. 2 is a partly enlarged cross section of the flexible circuit board, showing that the flexible circuit board is covered by a screen.

Referring to FIG. 2, the flexible circuit substrate 1 is covered with a screen 2 which defines a pattern hole 20 corresponding to the conductive pattern 201 of the flexible circuit substrate 1. Then a paste 3, such as a peelable ink containing epoxy-silicone hybrid materials is applied onto the screen 2.

Figure 3:
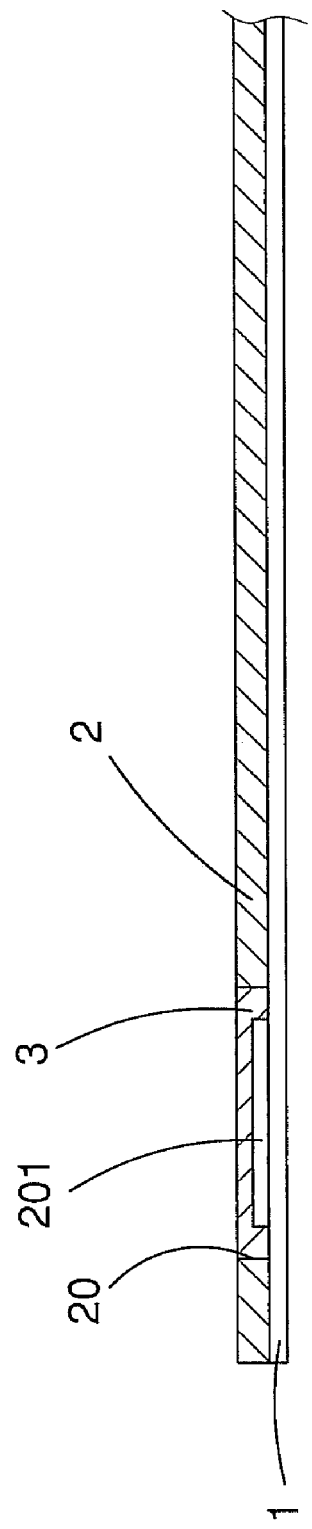
FIG. 3 is a partly enlarged cross section of the flexible circuit board, showing that a pattern hole of the screen is filled with a paste.

Next, as shown in FIG. 3, the paste 3 is transferred into the pattern hole 20 of the screen 2 by using a scraper so as to cover the conductive pattern 201 of the flexible circuit substrate 1. After the pattern hole 20 of the screen 2 is filled with the paste 3, the screen 2 is then removed.

Figure 4:
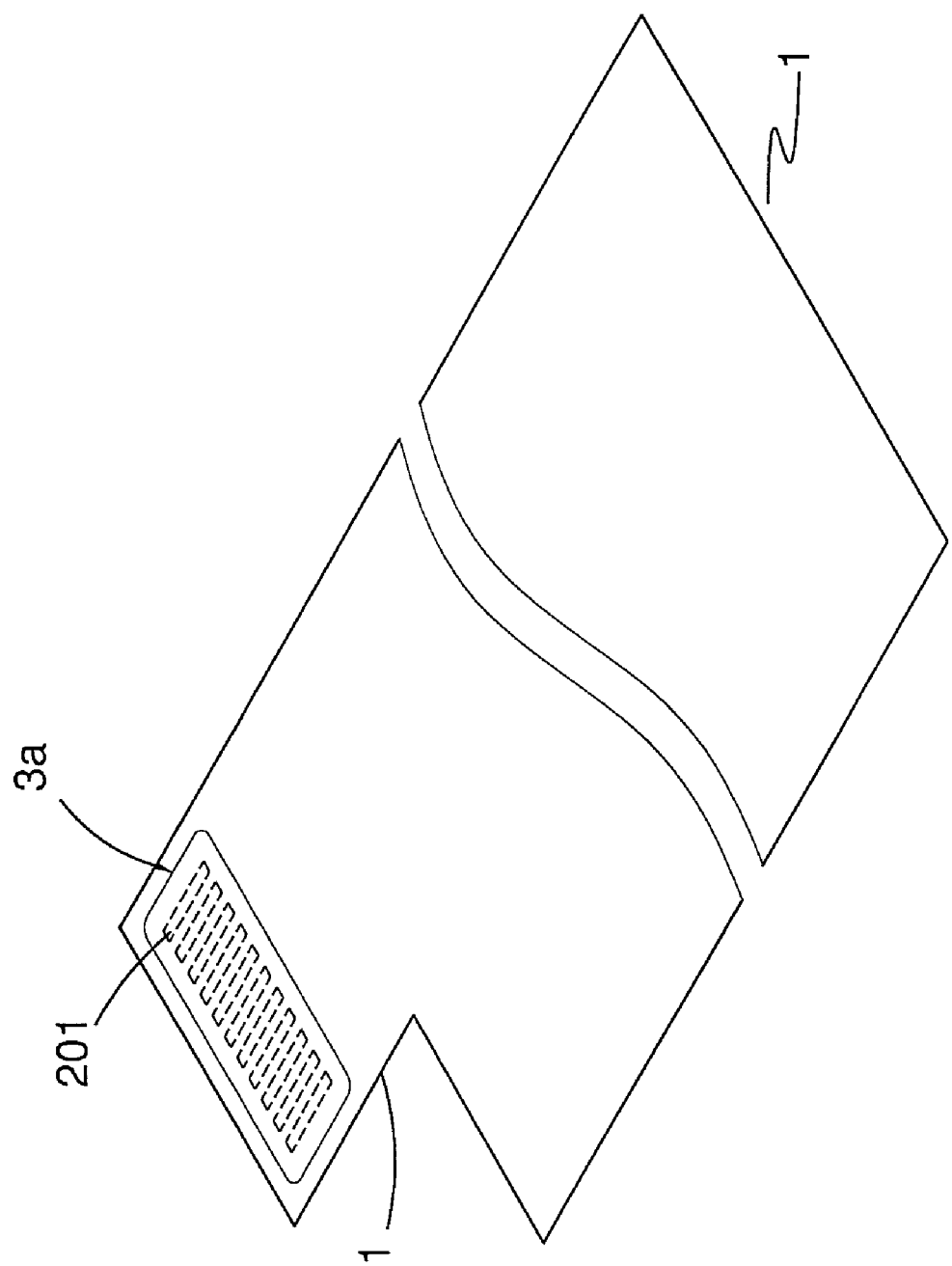
FIG. 4 is a view similar to FIG. 1, illustrating an exposed region of the flexible circuit substrate is covered with the cured paste.
Figure 5:
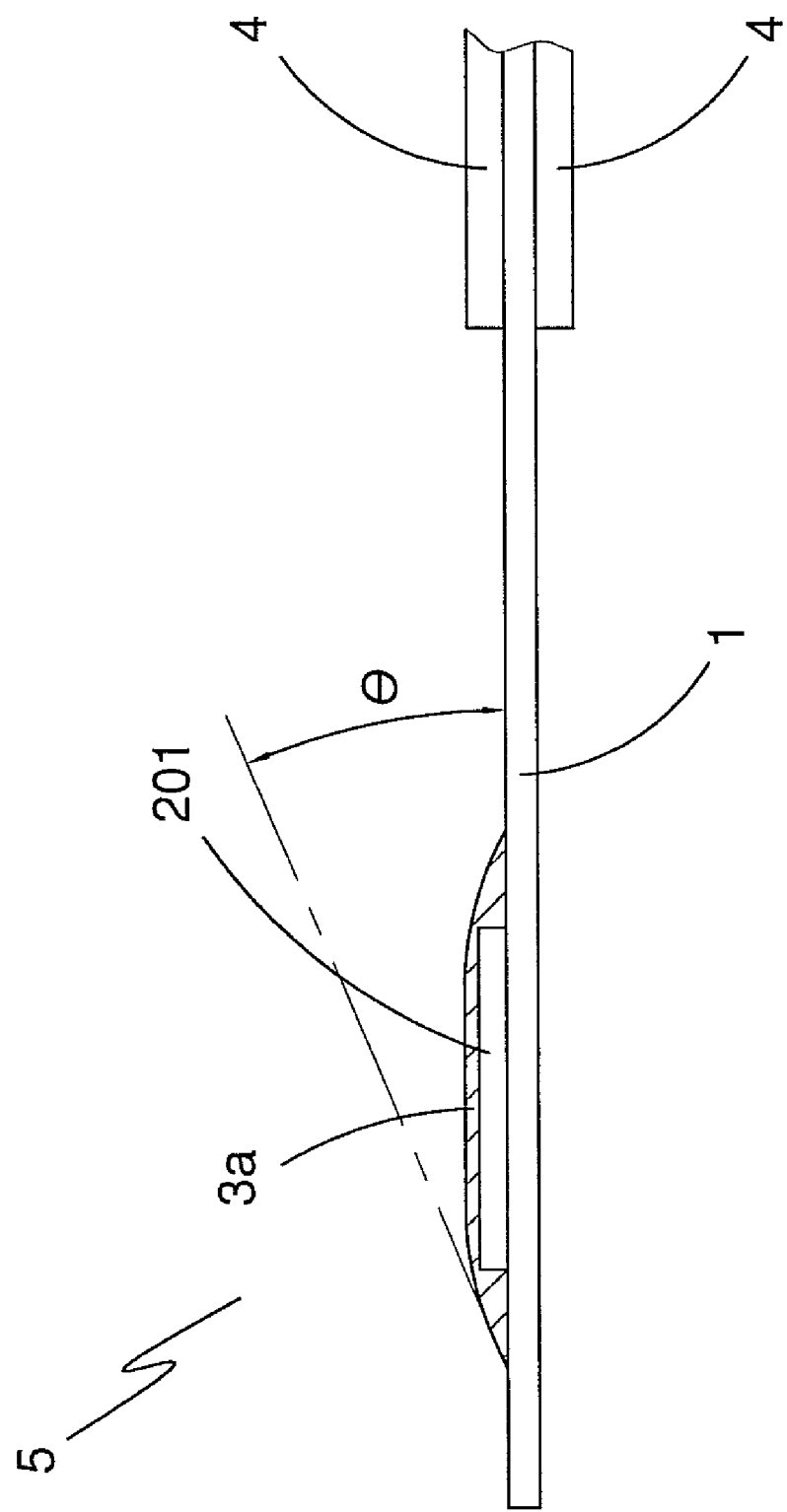
FIG. 5 is a partly enlarged cross section of a rigid-flex PCB, showing that the flexible circuit substrate is served as core of the rigid-flex PCB.

Thereinafter the paste 3 which covers the conductive pattern 201 is cured under predetermined conditions to be transformed into a peelable mask 3a, as shown in FIGS. 4 and 5.

Finally, the rigid circuit substrate 4 is bonded onto the rigid region 10 of the flexible circuit substrate 1 so that the flexible and rigid circuit substrates 1, 4 are combined together to form a rigid-flex PCB 5, as shown in FIG. 5. Note that the rigid circuit substrate 4 may be single-layered or multiply.

As described above, the screen-printing process is applied to transfer the paste 3, later as a peelable mask 3b, onto the conductive pattern 201. Alternatively, a blank screen printing, a non-screen printing or a steel screen printing may be used.

Further, the aim is to ensure that the each critical process is under proper control, such as the thickness of the screen 2, the material ratio of the paste 3, speed at which the scraper is operated, pressure applied by the scraper to the screen 2, curing temperature and time in order that the peelable mask 3a may be formed with a contact angle θ greater than 20 degrees, be easily peeled away by hand and has heat resistance and chemical resistance, whereby the peelable mask 3a is able to withstand the extreme operating temperatures and chemical environments while the rigid circuit board 4 is building up.

Since the peelable mask 3a covers the conductive pattern 201 while the rigid circuit board 4 is being built up, the conductive pattern 201 is protected from damage from the chemical or high temperature. When the conductive pattern 201 is to be used, the peelable mask may be then removed therefrom clearly simply by hand. Further, according to experiment data, when the contact angle θ of the peelable mask 3*a* is smaller than 20 degrees, edges of the peelable mask 3*a* become thin and easily to be burned while curing. If so, the peelable mask 3*a* would not be easily removed and residue may remain after the removal of the peelable mask 3*a*.

Accordingly, by provision of the peelable mask 3*a*, the conductive pattern 201 which is formed on the exposed region 20 of the flexible circuit substrate 1 is well-protected since the reliable peelable mask 3*a* is formed on the flexible circuit substrate 1 before the rigid circuit substrate 4 is built up. Further, the peelable mask 3*a* is made of materials containing epoxy-silicone hybrid resins and is treated under proper control so as to become easily peeled and reliable due to its great heat resistance and chemical resistance.

The foregoing description is for purposes of illustration only and is not intended to limit the scope of the protection accorded this invention. The scope of protection is to be measured by the following claims, which should be interpreted as broadly as the inventive contribution permits.

The invention claimed is:

1. A method of manufacturing a rigid-flexible printed circuit board, comprising steps of:
    providing a flexible circuit substrate; said flexible circuit substrate defining a rigid region and an exposed region and having a conductive pattern formed on said exposed region;
    printing a paste containing epoxy-silicone hybrid materials onto said conductive pattern under predetermined conditions;
    curing said paste that covers on said conductive pattern; and
    building up a rigid circuit substrate on said rigid region of said flexible circuit substrate;
    wherein said paste having a specific composition is subjected to predetermined conditions of temperature and time in order to transform said paste into a peelable mask with heat resistance, chemical resistance and a contact angle greater than 20 degrees.

* * * * *